(12) United States Patent
Ramirez

(10) Patent No.: US 9,099,955 B2
(45) Date of Patent: Aug. 4, 2015

(54) EARLY NOTIFICATION OF POWER LOSS IN THREE PHASE METER

(75) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 614 days.

(21) Appl. No.: 13/538,159

(22) Filed: Jun. 29, 2012

(65) Prior Publication Data

US 2014/0002169 A1    Jan. 2, 2014

(51) Int. Cl.
*H03K 5/00* (2006.01)
*H03B 1/00* (2006.01)
*G01R 19/155* (2006.01)
*G01R 22/06* (2006.01)

(52) U.S. Cl.
CPC ............... *H03B 1/00* (2013.01); *G01R 19/155* (2013.01); *G01R 22/068* (2013.01)

(58) Field of Classification Search
CPC .......................................................... G06F 1/10
USPC ........................................................ 327/299
See application file for complete search history.

(56) References Cited

U.S. PATENT DOCUMENTS

2009/0055031 A1*   2/2009   Slota et al. ..................... 700/287

* cited by examiner

*Primary Examiner* — Daniel Puentes
(74) *Attorney, Agent, or Firm* — Maginot, Moore & Beck LLP

(57) ABSTRACT

A circuit arrangement generates an output oscillating signal indicative of voltage on any of plurality of line voltages. The circuit arrangement includes at least two zero-crossing detectors, a combiner, an integrator, and an oscillator. The first zero-crossing detection circuit detects a voltage level crossing on a first electrical signal corresponding to a first line voltage. The second zero-crossing detection circuit detects a voltage level crossing on a second electrical signal corresponding to a second line voltage. The combiner combines the output signals of the first zero-crossing detection circuit and the second zero-crossing detection circuit. The integrator is coupled to the output of the combiner. The oscillator has a control input and an oscillating signal output. The oscillator generates an oscillating signal at the oscillating signal output based on a signal present at the control input. The control input receives an output signal of the integrator.

14 Claims, 5 Drawing Sheets

EARLY NOTIFICATION OF POWER LOSS IN THREE PHASE METER

FIELD OF THE INVENTION

The present invention relates generally to electricity meters, and more specifically, to the generation of a consistent reference signal within an electricity meter.

BACKGROUND OF THE INVENTION

Electronic utility meters include circuits that obtain power from a power supply that is connected to the utility power lines. In the event of a power interruption on the power lines, electronic utility meters typically shut down or enter a "sleep" mode due to the lack of power to the power supply. Conventionally, electronic meters employ a series of shutdown operations upon detection of a power interruption to ensure a graceful power down. The shutdown operations include the storage of various metering values into flash memory or the like. In addition, if the meter includes an automatic meter reading ("AMR") transmitter, then the shutdown operations can include a so-called "last gasp" transmission that transmits a trouble signal and/or metering information to a remote device monitored by the utility service provider.

Because the utility power to the power supply has been lost in a power interruption, the shutdown operations obtain power from one or more temporary source of power, such a capacitor or a battery. In order to ensure that a sufficient amount of temporary power is available, it is important to initiate the last gasp transmission and other shut down procedures in a timely manner. Without a timely detection of this event, normal operations may continue, depleting the energy stored in the temporary power supply, compromising the meter's ability to complete a last gasp communication.

There are known methods of detecting a power outage. For example, it is known to use a DC-rectified measurement of the line voltage to determine when line voltage is interrupted. Such circuits typically involve a voltage divider, a diode and a smoothing capacitor. The circuit elements are arranged such that when nominal voltage (e.g. 240 VAC) is available, the output signal has a voltage level above a threshold voltage for signaling to processing circuitry that line voltage is present. One drawback of this method is that in order to accommodate line voltage fluctuations, the threshold must be set to allow for lower average line voltages. As a result, when a line voltage interruption occurs when the line voltage is normal, the circuit has a delayed reaction to a line interruption due to the delay in the decline of the average voltage past the threshold set for lower average line voltages.

Accordingly, another known method of providing line voltage presence information is using a zero crossing detector. In particular, electricity meters often include zero-crossing detectors that are used to help synchronize internal oscillator circuits. Such zero-crossing detectors provide a digital output signal that transitions each time the detected line voltage crosses zero volts in the AC cycle. The constant 60 Hz digital output signal thus provides both a synchronization reference signal for internal timing circuits, but also a "heartbeat" signal used by the processing circuit to determine whether line voltage is present. Specifically, if the processing circuit identifies that that the "heartbeat" signal missed a transition, then it can begin power down operations.

A recent development in electricity meters is the three-phase power supply. In the past, meters employed a power supply for internal circuitry powered off of one of the three line phase voltages. For example, in a well-known three-phase power system including phase A, phase B and phase C, the electricity meter power supply may be connected to phase C. A drawback to this configuration was that it is possible that power could be lost on phase C, but not phase A and/or phase B. In such a case, the meter power supply would lose input power, leading to shutdown of the meter, even though the customer or load was still receiving power on phase A and phase B. Accordingly, it has become more common to employ a three-phase power supply that provides power to the internal metering circuits of an electricity meter as long as there is power on any of the three phases.

Meters employing three-phase power supplies require a power outage detection circuit that can detect when line voltage is missing from all three phases of the electrical service. If and only if the meter loses power on all three phases, then the meter can perform the power down operations. In one prior art example, the meters used a composite signal of three zero-crossing pulse signals. Each phase included a zero-crossing circuit that generated a short-duration pulse signal at each zero crossing. The short-duration pulse signals of all three phases were combined into a single pulse signal. The resulting pulse signal had a varying frequency and/or duty cycle based on the presence or absence of certain phases of the circuit. For example, if power was available on all three phases, then the composite pulse signal would have a pulse frequency of 360 pulses per second (2 zero crossings per cycle, 60 cycles per second, for each of three phases). If, however one of the phases was missing, then the composite pulse signal would have a pulse frequency of 240 pulses per second.

While the composite signal allowed for the processing circuit to detect the presence of at least one line voltage, the use of the signal for this purpose and for synchronization purposes was complex, given the variable frequency and duty cycle.

Accordingly, there exists a need for a method and apparatus for early detecting of power outages in all phases of a multiple phase power line that provides for simpler processing and use for synchronization purposes.

SUMMARY OF THE INVENTION

The present invention addresses the above-described need, as well as others, by providing a circuit that generates a single periodic signal that is consistent in waveform as long as a zero-crossing detector detects zero-crossings (i.e. a line voltage) in any of phases of a multi-phase electrical service. The resulting signal effectively emulates the output of a simpler single phase zero crossing detector, thereby reducing the need for logic in processing variable outputs based on the presence or absence of one or more line voltages.

A first embodiment is a circuit arrangement that generates an output oscillating signal indicative of voltage on any of plurality of line voltages. The circuit arrangement includes at least two zero-crossing detectors, a combiner, an integrator, and an oscillator. The first zero-crossing detection circuit detects a voltage level crossing on a first electrical signal corresponding to a first line voltage. The second zero-crossing detection circuit detects a voltage level crossing on a second electrical signal corresponding to a second line voltage. The combiner combines the output signals of the first zero-crossing detection circuit and the second zero-crossing detection circuit. The integrator is coupled to the output of the combiner. The oscillator has a control input and an oscillating signal output. The oscillator is configured to generate an oscillating signal at the oscillating signal output based on a signal present at the control input, and wherein the control input is operably coupled to receive an output signal of the integrator.

The above-described features and advantages, as well as others, will become more readily apparent to those of ordinary skill in the art by reference to the following detailed description and accompanying drawings.

DETAILED DESCRIPTION

Figure 1:
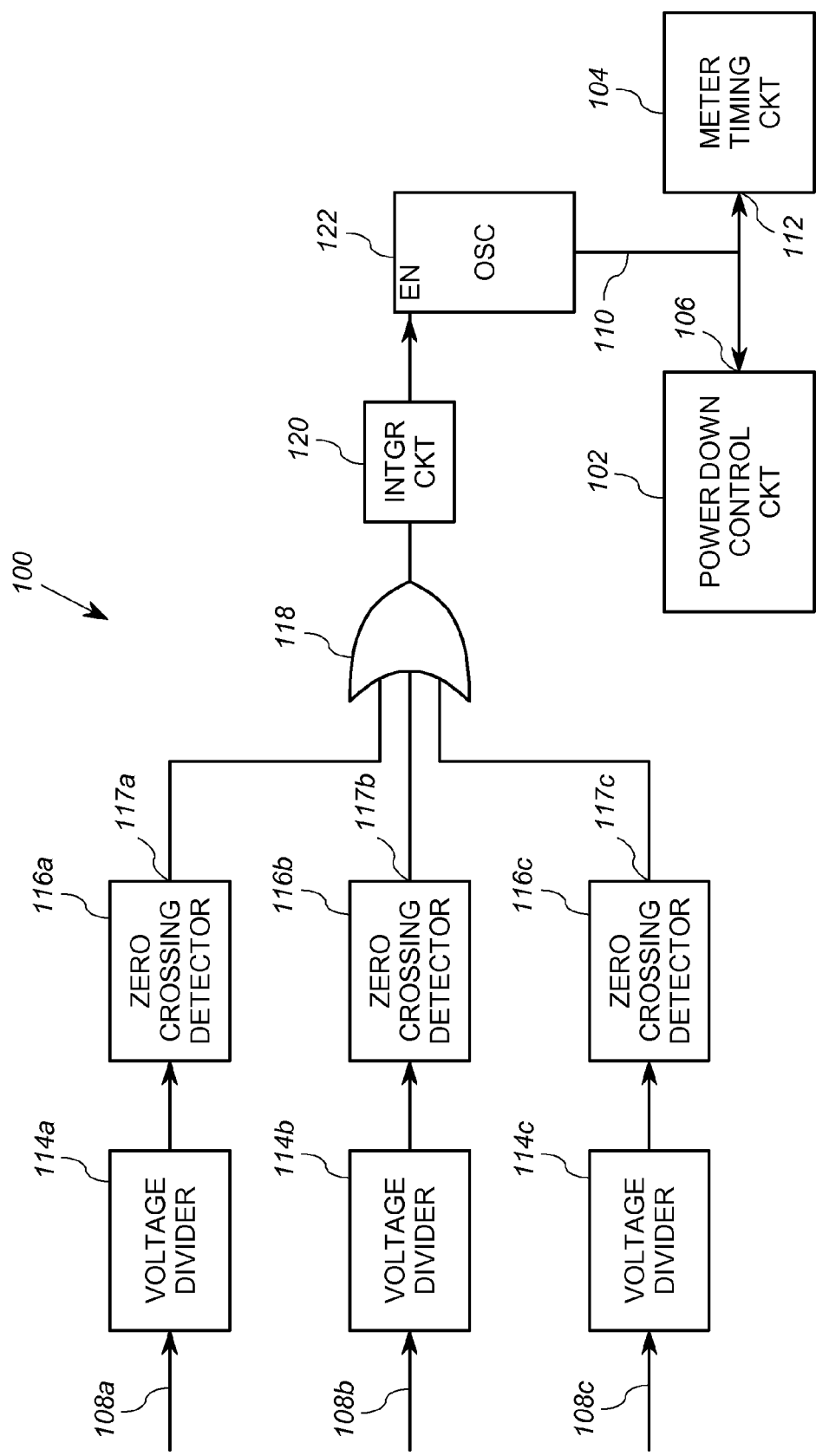
FIG. 1 shows a schematic diagram of an exemplary arrangement that generates an oscillating signal responsive to the presence of any of three line voltages for use in power down detection and/or timing in a utility meter.

FIG. 1 shows a schematic diagram of an exemplary arrangement 100 that generates an oscillating signal responsive to the presence of any of three line voltages for use in a power down control circuit 102 and a timing circuit 104 of a utility meter. The exemplary arrangement 100 includes inputs 108a, 108b, 108c for receiving line voltage signals, and an output 110. As will be discussed in detail further below, the exemplary arrangement in this embodiment is configured to generate a 60 Hz pulse signal at the output 110 as long as there is an active AC line voltage at any of the inputs 108a, 108b and 108c. The output 110 is operably connected to the power down control circuit 102 and the timing circuit 104.

The power down control circuit 102 is a circuit that initiates and executes a sequence of operations within the meter circuits to effectuate a power down routine. To this end, the power down control circuit 102 includes a first input 106 coupled to the output 110 of the arrangement 100. In general, the power down control circuit 102 is configured to initiate and execute the power down routine responsive to a signal (or lack thereof) at the first input 106. In the embodiment described herein, the power down control circuit 102 is specifically configured to detect an interruption of a 60 Hz pulse signal at the input 106, and initiate the power down routine responsive to the detected interruption. The exact details of the power down control circuit 102 may take many forms, and would be known to those of ordinary skill in the art.

For example, the power down routine can include steps that transfer critical data into flash or other non-volatile memory, and then place one or more processing devices in a sleep mode. In meters having AMR devise, the power down routine can involve a so-called "last gasp" transmission providing data and/or indication of the power down to a centralized control station or computer. Multiple power down routines, and the circuits capable of performing them, are known. Typically, the power down control circuit 102 includes the main meter microcontroller or other processor, which also serves other purposes. As will be discussed below in connection with FIG. 2, the power down control circuit 102 is implemented in the exemplary meter 200 in the controller 220.

The meter timing circuit 104 is a circuit that generates one or more timing signals used for utility meter timing operations, such as those used for "time of use" metering or "demand" metering. The meter timing circuit 104 includes an input 112, and is configured to generate timing signals based at least in part on 60 Hz pulse signals received at the input 112. Such timing circuits are known.

Referring now to the arrangement 100, the arrangement includes three voltage dividers 114a, 114b and 114c, three zero crossing detectors 116a, 116b and 116c, a combiner or "Or" circuit 118, an integrator circuit 120 and an oscillator 122.

The voltage divider 114a is operably coupled to the phase A line voltage input 108a, the voltage divider 114b is operably coupled to the phase B line voltage input 108b, and the voltage divider 114c is operably coupled to the phase C line voltage input 108c. Each of the voltage dividers 114a, 114b, and 114c is configured to convert a line voltage level (or at least a voltage representative of a line voltage) into low voltage or reduced line signal. The reduced line signal has a waveform that is representative of the line voltage. The voltage divider 114a is operably connected to provide the reduced phase A line signal to the zero crossing detector 116a, the voltage divider 114b is operably connected to provide the reduced phase B line signal to the zero crossing detector 116b, and the voltage divider 114c is operably connected to provide the reduced phase C line signal to the zero crossing detector 116c.

The zero crossing detector 116a includes a pulse output 117a, and is configured to generate a pulse signal at the pulse output 117a responsive to the detection of either a positive slope zero crossing or negative slope zero crossing of a received signal. The zero crossing detector 116b similarly includes a pulse output 117b and is configured in the same manner as the zero crossing detector 116a. Likewise, the zero crossing detector 116c includes a pulse output 117c and is configured in the same manner as the zero crossing detector 116a.

The combiner circuit 118 is a combiner that OR-adds three signals into a single output signal, the three inputs of the OR circuit 118 are connected to the pulse outputs 117a, 117b and 117c. The output of the OR circuit 118 is coupled to the integrator circuit 120. The integrated circuit 120 is configured to receive pulse inputs and to generate a sustained voltage signal between pulses of a sufficient frequency and duty cycle. In this embodiment, the integrator circuit 120 has a time constant such that the integrator output signal is in excess of the first threshold for at least one half-duty cycle and less than one duty cycle of the power line signal responsive to receiving a positive output signal from the OR circuit 118. For example, the duty cycle of the integrator circuit 120 in this embodiment is sufficient to maintain its integrator output circuit for the time between then end of one pulse from one of the zero crossing detectors 116x to the beginning of the next pulse of the same zero crossing detector 116x. As will be discussed below in further detail, such a time constant of the integrator circuit 120 causes the arrangement 100 to be able to maintain a pulse output signal even when only one of the phase voltage line signals is present.

The oscillator 122 is a circuit that is configured to generate a 60 Hz pulse signal at its output 122b responsive to the presence of an enable signal at an enable input 122a. In this embodiment the 60 Hz pulse signal has a 50% duty cycle. In any event, the output signal of the oscillator 122 has a consistent frequency and duty cycle as long as the signal at the enable input 122a exceeds the first threshold.

In normal operation, a 60 Hz AC voltage signal is present on the phase A, phase B and phase C line inputs 108a, 108b, 108c. The voltage divider 114a receives the phase A line voltage input 108a and generates a reduced phase A signal therefrom. The reduced phase A signal has the same waveform as the phase A line voltage, but has a substantially reduced magnitude. The voltage divider 114b similarly generates a reduced phase B signal, and the voltage divider 114c generates a reduced phase C signal. Each of the voltage dividers 114a, 114b, and 114c provides their respective reduced phase A, B, and C signals to the corresponding zero crossing detectors 116a, 116b and 116c.

Figure 4A:
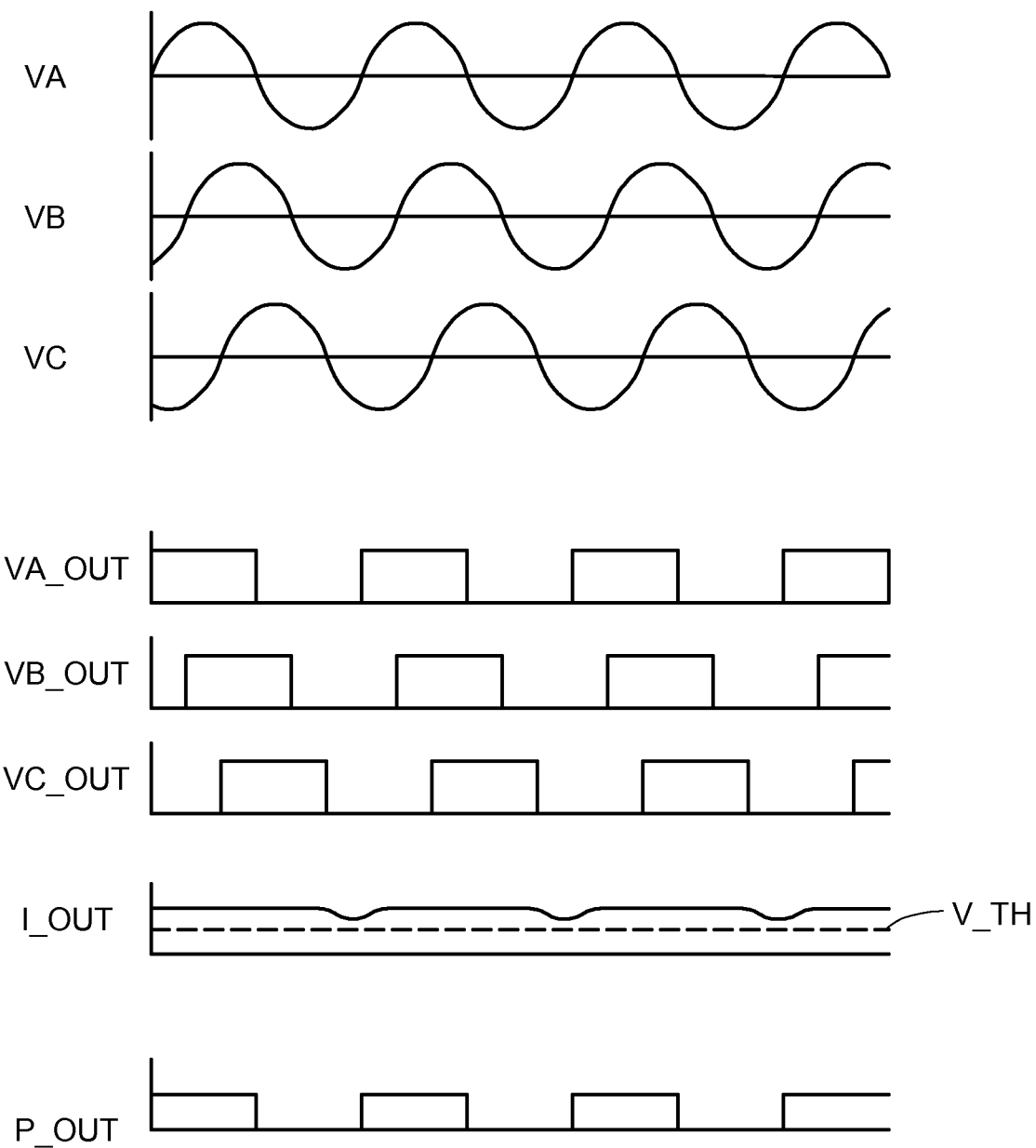
FIG. 4A shows a signal timing diagram of signals generated by the arrangement of FIG. 3 when all three phase voltages are present.

The zero crossing detector 116a generates a phase A pulse signal that transitions to positive (to logic "1" voltage) based on detection of a positive zero crossing. The zero crossing detector 116a is further configured to transition back to logic "0" voltage, based on the reduced phase A signal, after a period of time having a duration that is less than the full 60 Hz cycle. The zero crossing detector 116a provides the phase A pulse signal to the pulse output 117a. An exemplary signal timing diagram of a phase A pulse signal is shown in FIG. 4A as VA_OUT, which is discussed further below.

The zero crossing detector 116b operates in a similar way to generate a phase B pulse signal at the pulse output 117b. Likewise, the zero crossing detector 116c operates in a similar way to generate a phase C pulse signal at the pulse output 117c.

The combiner circuit 118 receives the phase A, phase B and phase C pulse output signals from the pulse outputs 117a, 117b and 117c. The combiner circuit 118 generates an output signal that has a magnitude approximately equal to the instantaneous magnitude of a maximum of the phase A, phase B and phase C pulse output signals. The integrator circuit 120 receives combined output signal and generates a sustained voltage signal that exceeds the first threshold voltage for the enable input 122a of the oscillator 122.

The oscillator 122 receives the enable signal exceed the threshold voltage at its input 122a and generates a 60 Hz pulse output signal responsive thereto. The oscillator 122 provides the 60 Hz pulse output signal to the output 110. The power down control circuit 102 receives the pulse output signal from the output 110, as does the timing control circuit 104.

The power down control circuit 102, responsive to the 60 Hz pulse signal, allows the normal meter processes to continue, or in other words, refrains from initiating the power down operations. The timing circuit 104 uses the pulse output signal from the output 110 in any suitable manner, many of which are known in the art, to synchronize timing operations within the meter.

Accordingly, when all three phase voltages are present, the arrangement 100 provides a 60 Hz pulse signal that is used by the timing circuit 104 for synchronization, and which is used by the power down control circuit 102 to determine not to initiate power down operations.

In the event of a power interruption on all three phases (e.g., due to an electrical service interruption or outage), no 60 Hz AC voltage signal is present on any of the phase A, phase B and phase C line inputs 108a, 108b, 108c. As a consequence, the voltage dividers 114a, 114b, and 114c provide no output signals to their respective zero crossing detectors 116a, 116b, 116c. At the moment of or immediately following the interruption, all of the zero crossing detectors 116a, 116b, 116c transition their outputs 117a, 117b and 117c to zero.

The combiner circuit 118 receives the three zero volt outputs, and generates a zero volt output signal. The integrator circuit 120 receives zero volt combiner output signal. At the time of the transition from the presence of the AC voltage line signals to the loss of the line signals, the integrator circuit 120 holds its output instantaneously above the threshold for the enable input 122a of the oscillator. Thereafter, the output signal of the integrator circuit 120 decays to below the first threshold voltage of the oscillator 122. The rate of decay is a function of the time constant of the integrator 122. In this embodiment the output signal of the integrator 120 decays below the threshold in a time that is less than one 60 Hz cycle. After the output signal of the integrator 120 falls below the threshold, it remains there until power is restored and zero-crossings are detected by the zero crossing detectors 116a, 116b, 116c.

Once the output signal of the integrator 120 falls below the enable threshold of the oscillator 122, the oscillator stops generating the 60 Hz output signal. Accordingly, no signal appears at the output 110 of the arrangement 100. In response to the interruption of the 60 Hz output signal at the output 110, the power down control circuit 102 begins a set of power down operations. For example, the power down control circuit 102 may cause storage of or more temporarily stored values to a non-volatile memory, not shown, within the meter. Alternatively, or in addition, the power down control circuit 102 may cause an RF transmitter, not shown, to transfer information to a remote device, also not shown, indicating the detection of a power interruption.

The meter timing circuit 104, upon losing the 60 Hz pulse signal at its input 112, no longer synchronizes any internal meter clocks using that signal.

Accordingly, the arrangement 100 operates to remove the 60 Hz pulse output signal upon timely determination that no AC voltage is present on any of the inputs 108a, 108b, 108c. That removal causes the power down control circuit 102 to timely being the power down operations.

Occasionally, there are situations in which an interruption occurs in only one or two phases, while at least one other phase remains live. In such situations, the arrangement 100 is configured to nevertheless continue to generate the 60 Hz pulse signal at the output 110. Accordingly, as long as a line voltage is present on any of the inputs 108a, 108b or 108c, the arrangement 100 generates the same 60 Hz pulse signal at its output 110.

By way of example, consider a situation in which power is only available on the phase C power line. In such a situation, a 60 Hz AC voltage signal is present only on the phase C line input 108c. The voltage divider 114c receives the phase C line voltage input 108c and generates a reduced phase C signal therefrom. The reduced phase C signal has the same waveform as the phase C line voltage, but has a substantially reduced magnitude. The voltage dividers 114a and 114b receive no signal, and thus generate no reduced line signals.

The voltage divider 114c provides the reduced phase C signal to the zero crossing detector 116c. The zero crossing detector 116c generates a phase C pulse signal that transitions to positive (to logic "1" voltage) based on detection of a positive zero crossing. The phase C pulse signal transitions back to logic "0" voltage after a duration of time, as discussed above. The zero crossing detector 116c provides the phase C pulse signal to the pulse output 117a. The zero crossing detectors 116a, 116b receive no signal and therefore do not generate corresponding pulse output signals.

The combiner circuit 118 receives the phase C output signal from the pulse output 117c, but no pulse signals from the outputs 117a or 117b. The combiner circuit 118 generates an output signal that has a magnitude approximately equal to the phase C pulse signal. The integrator circuit 120 receives combiner output signal and generates a sustained voltage signal that exceeds the first threshold voltage for the enable input 122a of the oscillator 122. While the phase C pulse signal is in the low state ("0" logic value), the integrator circuit 120 sustains the combiner output signal such that the output signal of the integrator circuit 120 remains above the enable signal threshold of the oscillator 122 from the time period that the phase C pulse signal transitions to the "0" state until the phase C pulse signal transitions back to the "1" state. Accordingly, as long as the AC voltage is present on the phase C line input 108c (or any other line input), the integrator 120 generates an output signal that is continuously above the first threshold voltage of the oscillator input 122a.

The oscillator 122 receives the enable signal from the integrator (which exceeds the first threshold voltage) at its input 122a and generates a 60 Hz pulse output signal responsive thereto. The oscillator 122 provides the 60 Hz signal to the output 110. The power down control circuit 102 receives the pulse output signal from the output 110. The power down control circuit 102 responsive to the 60 Hz pulse signal, allows the meter processes to continue, or in other words, refrains from initiating the power down sequence. The timing circuit 104 also receives the pulse output signal from the output 110, and uses the signal in any suitable manner, many of which are known in the art, to synchronize timing operations within the meter.

Accordingly, when only a single phase voltage is present, the arrangement 100 provides a 60 Hz pulse signal that is used by the timing circuit 104 for synchronization, and which is used by the power down control circuit 102 to determine not to initiate power down operations. It can readily be seen that the arrangement 100 similarly provides a 60 Hz pulse signal at the output 110 when any two phase voltages are present.

Figure 2:
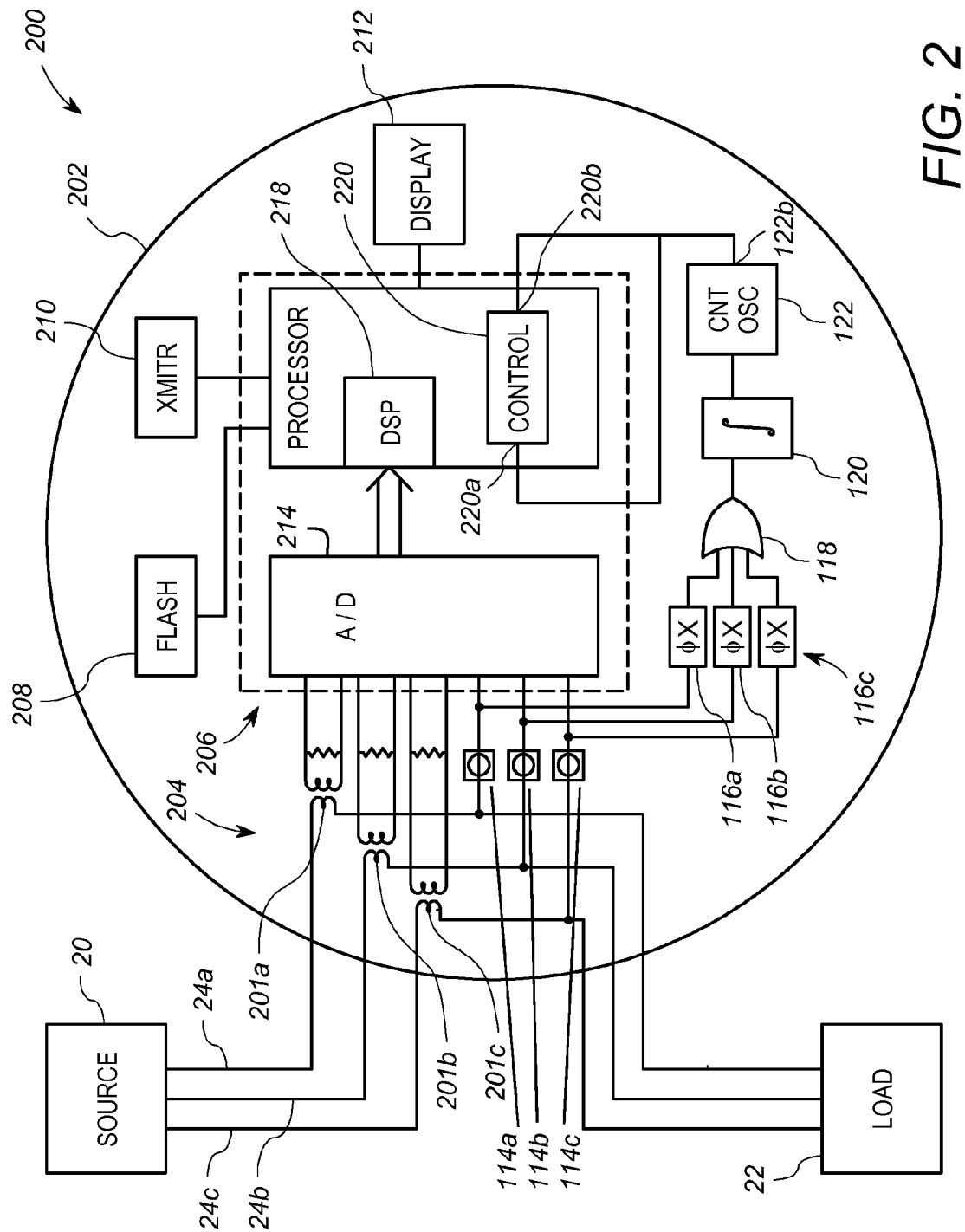
FIG. 2 shows a schematic block diagram of the arrangement of FIG. 1 implemented within an exemplary meter.

FIG. 2 shows the arrangement 100 of FIG. 1 implemented within the context of an exemplary meter 200. It will be appreciated that the meter 200 is given by way of example only, and that the arrangement 100 may be employed on various types of electronic multi-phase meters. It will be appreciated that portions of the arrangement are or could be parts of an existing meter used for other purposes. For example, as will be discussed below, the voltage dividers 114a, 114b and 114c also serve as voltage dividers for the sensor or input circuit 204 of the meter 200.

In general, the meter 200 is configured to measure/meter energy consumption (and/or other energy consumption related values) based on electricity delivered from a source 20 (e.g. a utility service provider) to a load 22 (a residential, commercial or other customer site). In the example of FIG. 2, the source 20 delivers electricity to the load 22 in a three phase electrical service, as is known in the art. Phase A voltage is delivered on phase voltage line 24a, phase B voltage is delivered on phase voltage line 24b, and phase C voltage is delivered on phase voltage line 24c. Various methods of providing three phase electrical service to a customer load are known in the art.

Referring to FIG. 2, the meter 200 includes a housing 202 in which are disposed a sensor circuit 204, a measurement circuit 206, a flash memory 208, a transmitter 210, a display 212 and the arrangement 100. The housing 202 is a conventional electricity meter housing that provides protection from the elements and protection from meter tampering. In this embodiment, the measurement circuit 206 includes an analog-to-digital (A/D) converter 214 and a processing circuit 216.

The processing circuit 216 is further split into two functions: a digital signal processing portion (DSP) 218 and a controller 220. In some embodiments, the DSP 218 and the controller 220 are separate discrete devices. In other embodiments, the DSP 218 and the controller 220 are the same device, in which case the DSP 218 would represent the digital signal processing function of the device, while the controller 220 represents the control function of the device. In one known device, the A/D converter 214, the DSP 218 and the controller 220 are implemented in a single semiconductor package. In still other cases, some of the control function is carried out by more than one processor, including the processor that also carries out the digital signal processing function. Many suitable variants of the processing circuit 216, which may be programmed and configured as described herein, would be known to those of ordinary skill in the art.

The sensor circuit 204 includes circuits that are configured to generate voltage and current measurement signals that are representative of the voltage and current on phase A, phase B and phase C voltage lines 24a, 24b and 24c. The voltage and current magnitude signals are signals of much lower magnitude than the line voltage. Suitable sensor circuits are well-known in the art. For example, the current sensors may suitably include current transformers 201a, 201b, 201c, which are operably coupled to the A/D converter 214.

In this embodiment, the voltage sensors include the three voltage dividers 114a, 114b and 114c. The voltage divider 114a is operably coupled to the phase A voltage line 24a, the voltage divider 114b is operably coupled to the phase B voltage line 24b, and the voltage divider 114c is operably coupled to the phase C voltage 24c. As discussed above in connection with FIG. 1, the voltage dividers 114a, 114b, 114c are coupled to respective zero crossing detectors 116a, 116b and 116c. In addition, the voltage dividers 114a, 114b, and 114c are coupled to inputs of the A/D converter 214.

Referring further to the implementation of the arrangement 100 within the meter 200 of FIG. 2, the zero crossing detectors 116a, 116b and 116c are coupled to inputs of the combiner 118, which in turn is coupled to the integrator 120. As discussed above in connection with FIG. 1, the integrator 120 is coupled to the enable input 122a of the oscillator 122. The output 122b is coupled to inputs 220a, 220b of the controller 220. As will be discussed further below, the controller 220a uses the signal at the input to synchronize the real time clock maintained internally by the controller 220. As will also be discussed below, the controller 220 further monitors the input 220b to determine whether a power down procedure should be executed. Accordingly, in this embodiment, the controller 220 implements (typically at least in part via software instructions) both the power down control circuit 102 and the meter timing circuit 104 of FIG. 1.

Referring again to FIG. 2, the A/D converter 214 is operably coupled to provide digital voltage and current measurement samples to the DSP 218. The DSP 218 is configured to generate energy measurement values from the voltage and current measurement signals. The generated energy measurement values may suitably include values representative accumulated real power, RMS current, RMS voltage, and other values. The controller 220 is operably coupled to receive the energy measurement values from the DSP 218. The controller 220 is configured in some cases to further process the energy measurement values to generate billing information and/or power quality information. Such operations are known may take many forms. The controller 220 is further configured to control various operations, such as operations that display energy values on the display 212, that transmit values using the transmitter 210, and that store of values in the flash memory 208.

The transmitter 210 is a circuit configured to transmit meter data, under the control of the controller 220, to a remote device. As is known in the art, the transmitter 210 can be used to provide automated meter reading ("AMR") operations.

AMR operations allow the utility service provider to obtain consumption and/or billing information from the meter 200 from a remote location, thereby eliminating the need for personnel that travel to the meters to obtain such data. In addition, the transmitter 210 can be used to transmit information indicating the loss of power to the meter 200 in a so-called "last gasp" transmission. The last gasp transmission informs the utility service provider that the meter 200 is losing power, which could be the result of a service outage, or due to tampering with the meter 200.

The display 212 is any suitable meter display. Typically, the display 212 is a segmented LCD display, but other displays may be employed.

In operation, the source 20 provides electrical power to the load 22 via the power lines 24a, 24b and 24c. The sensor circuit 204 receives line signals from on the phase A, B and C power lines 24a, 24b and 24c. The current sensors 201a, 201b and 201c generate current measurement signals from the received phase A, B and C line signals, and provide the current measurement signals to the A/D converter 214. The voltage dividers 114a, 114b and 114c generate voltage measurement signals from the received phase A, B and C line signals, and provide the voltage measurement signals to the A/D converter 214. The voltage dividers 114a, 114b and 114c also provide the voltage measurement signals to the zero crossing detectors 116a, 116b and 116c, respectively.

The A/D converter 214 receives the current measurement signals and generates digital current measurement signals therefrom. The A/D converter 214 also receives the voltage measurement signals and generates digital voltage measurements signals therefrom. The A/D converter 214 provides the digital voltage and current measurements signals to the DSP 218. The DSP 218 generates various energy measurement values, for example, accumulated real energy, from the digital voltage and current measurement signals. Methods of calculating various energy values from sampled voltage and current measurement waveforms are well known.

Referring again to the zero crossing circuits 116a, 116b and 116c, the zero crossing circuits 116a, 116b and 116c cooperate with the combiner 118, the integrator 120 and the oscillator 122 to generate a 60 Hz pulse output signal in the manner discussed above in connection with FIG. 1. In particular, as long as line voltage is present on at least one of the power lines 24a, 24b and 24c, the arrangement 100 provides a 60 Hz pulse output signal to the inputs 220a, 220b of the controller 220.

The controller 220 receives the energy measurement values from the DSP 218. In one operation, the controller 220 causes the display 212 to display information generated based on the energy measurement values. The controller 220 may further generate specialized billing information, such as time-of-use billing information or demand billing information. The controller 220 also from time to time causes the transmitter 210 to transmit the generated metering information to a remote device to carry out AMR operations.

The controller 220 also uses the signal received at the input 220a to synchronize internal timing circuits. For example, the controller 220 typically maintains a real-time calendar clock (day, date) for certain billing operations, such as time-of-use billing, and demand billing. The controller 220 may also maintain a real-time clock for other purposes. In the embodiment described herein, the controller 220 uses the signal received at the input 220a to operate the real-time clock. In other words, after determining a start time and date, the controller 220 increments the real-time clock value every second based on a certain count of the pulses (e.g. 60) received at the input 220a.

The controller 220 further uses the same signal received at the input 220b to determine that the meter 200 is still receiving power. If so, then the controller 220 continues with normal (i.e. non-power down) operations because there is no need to perform the power down operations. More specifically, the controller 220 monitors the signal at 220b to see determine whether a predetermined amount of time occurs without a positive pulse. If a predetermined amount of time passes without a positive pulse, then the controller 220 performs the power down operations. Otherwise, the controller 220 continues with other, non-power down operations. The predetermined amount of time is preferably a time that is less than entire duty cycle of the 60 Hz pulse signal normally provided by the oscillator 122, but greater than the duration of the normal "0" state of the pulse signal. Thus, in an embodiment when the oscillator 122 produces a 50% duty cycle 60 Hz pulse signal, the controller 220 executes its power down operations when the input signal at the input 220b remains low for a duration longer than 50% of the 60 Hz duty cycle, for example, 75% or more of the 60 Hz duty cycle.

Thus, FIG. 2 shows an exemplary embodiment of the arrangement 100 for generating a 60 Hz pulse signal implemented in the environment of a meter 200. As discussed above, the arrangement 100 provides the advantage that the controller 220 of the meter 200 sees an identical 60 Hz pulse signal as long as there is a line voltage on any of the phase voltage lines 24a, 24b and 24c. As a result, the controller 220 only implements power down operations when all phase voltages are missing, and furthermore has a consistent 60 Hz signal for synchronizing timing operations regardless of which, or how many, phase voltages are present, so long as at least one is present.

Figure 3:
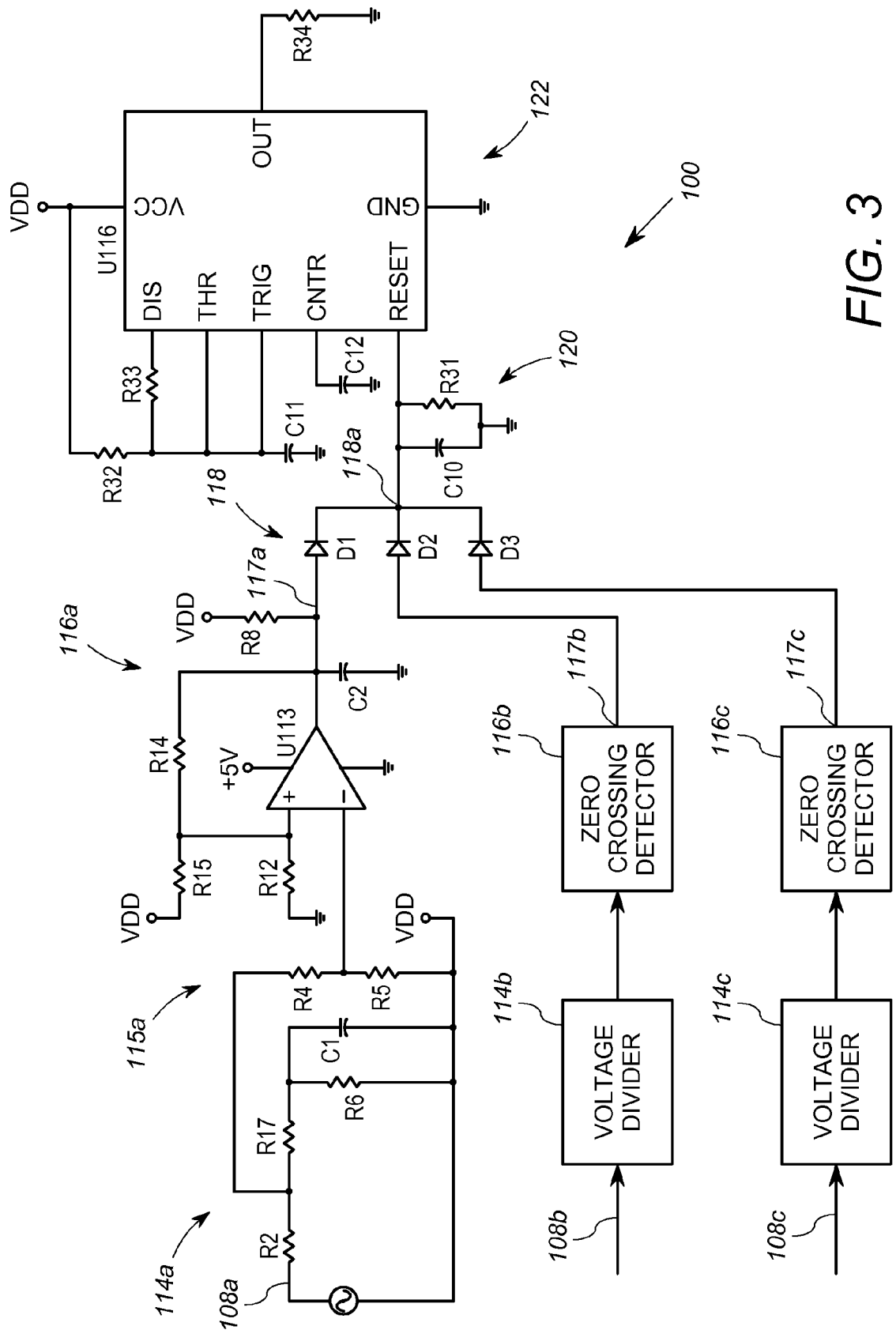
FIG. 3 shows a schematic diagram of an exemplary embodiment of the arrangement of FIG. 1.

FIG. 3 shows in further detail an exemplary embodiment of the arrangement 100 of FIG. 1. Referring to FIG. 3, the voltage divider 114a in this embodiment includes resistors R2 and R17, with the output 115a generating a divided voltage that, is approximately a little less than $\frac{1}{100}^{th}$ of the input voltage. Exemplary values of R2 and R17 are 1000 k-ohm and 8.49 k-ohm, respectively. The output 115a is coupled thereafter to the zero crossing detector 116a, and more specifically, to a resistor R4.

The input side of the zero crossing detector includes the resistor R4, which has a nominal value of 422 k-ohm, and is series connected to a resistor R5, which has a nominal value of 249 k-ohm. The resistor R5 is coupled a DC voltage source of 3.3. volts VDD, which in turn is coupled to the lower rail of the AC input 108a. The junction of the resistors R4 and R5 is coupled to a comparator U113 as will be discussed below. The arrangement of the voltage source VDD on the AC input 108a operates to DC bias the measurement signal (i.e. the reduced AC waveform) to stay above zero volts with respect to ground. Such an arrangement allows for ease of measurement and digitization of AC signals by other circuits in the meter.

As discussed above, the zero crossing detector 116a further includes an operational amplifier or comparator U113. The comparator U113 is an ordinary op-amp comparator having a positive (or non-inverting) input and a negative (or inverting) input. The negative input is coupled the node between resistors R4 and R5. The positive input of the comparator U113 is coupled to resistors R7, R10 and R9. The resistor R7, which has a nominal value of 499 k-ohm in this example, is further coupled to DC ground. The resistor R10, which has a nominal value of 33.2 k-ohm in this example, is further coupled to the 3.3 voltage DC source VDD. The resistor R9, which has a nominal value of 1000 k-ohm in this example, is a feedback resistor further coupled to the output OUT of the comparator U113. The output OUT of the comparator U113 is also the output 117a of the zero crossing detector 116a. The zero crossing detector 116a further includes a capacitor C2, which is 330 pf, coupled between the output 117a and DC ground, and a resistor R8, which is 10 k-ohm, coupled between the 3.3 volt DC source VDD and the output 117a.

The other zero crossing detectors 116b and 116c may suitably have substantially identical constructions.

The combiner includes three diodes D1, D2, D3 and an output node 118a. The diode D1 is coupled a forward biased manner from the output 117a to the node 118a. Similarly, the diode D2 is coupled a forward biased manner from the output 117b to the node 118a, and the diode D3 is coupled a forward biased manner from the output 117c to the node 118a. The integrator 120 is further coupled to the node 118a. The integrator 120 includes a capacitor C10, which is 0.22 µF, coupled between the node 118a and DC ground, and a resistor R31, which is 200 k-ohm, coupled between the node 118a and DC ground.

The oscillator 122 is an astable oscillator that includes a timer chip U116, which in this embodiment is an LM555 available from Texas Instruments. The timer chip U116 is configured in the manner described below to generate a 50% duty cycle 60 Hz pulse signal when it receives a suitable enabling signal from the integrator 120. In particular, the timer chip U116 as is known in the art has a bias voltage pin VCC, a discharge pin DIS, a threshold pin THR, a trigger pin TRIG, a control pin CNTR, a reset pin RESET, a ground pin GND, and an output pin OUT. The oscillator 122 further includes a capacitor C12 (0.01 µF) coupled between ground and the pin CNTR, a capacitor C11 (0.22 µF) coupled between ground and the pin THR and TRIG at a node 122c. The oscillator 122 also includes a resistor R33 (22 k-ohm) coupled between the pin DIS and the node 122c, and a resistor R32 (52 k-ohm) coupled between the pin VCC and the node 122c. The reset pin RESET is coupled to the oscillator input 122a (and hence the output of the integrator 120). The pin VCC is coupled to the voltage source VDD, and the pin GND is coupled to DC ground. The output pin OUT forms the output 122b of the oscillator.

Figure 4B:
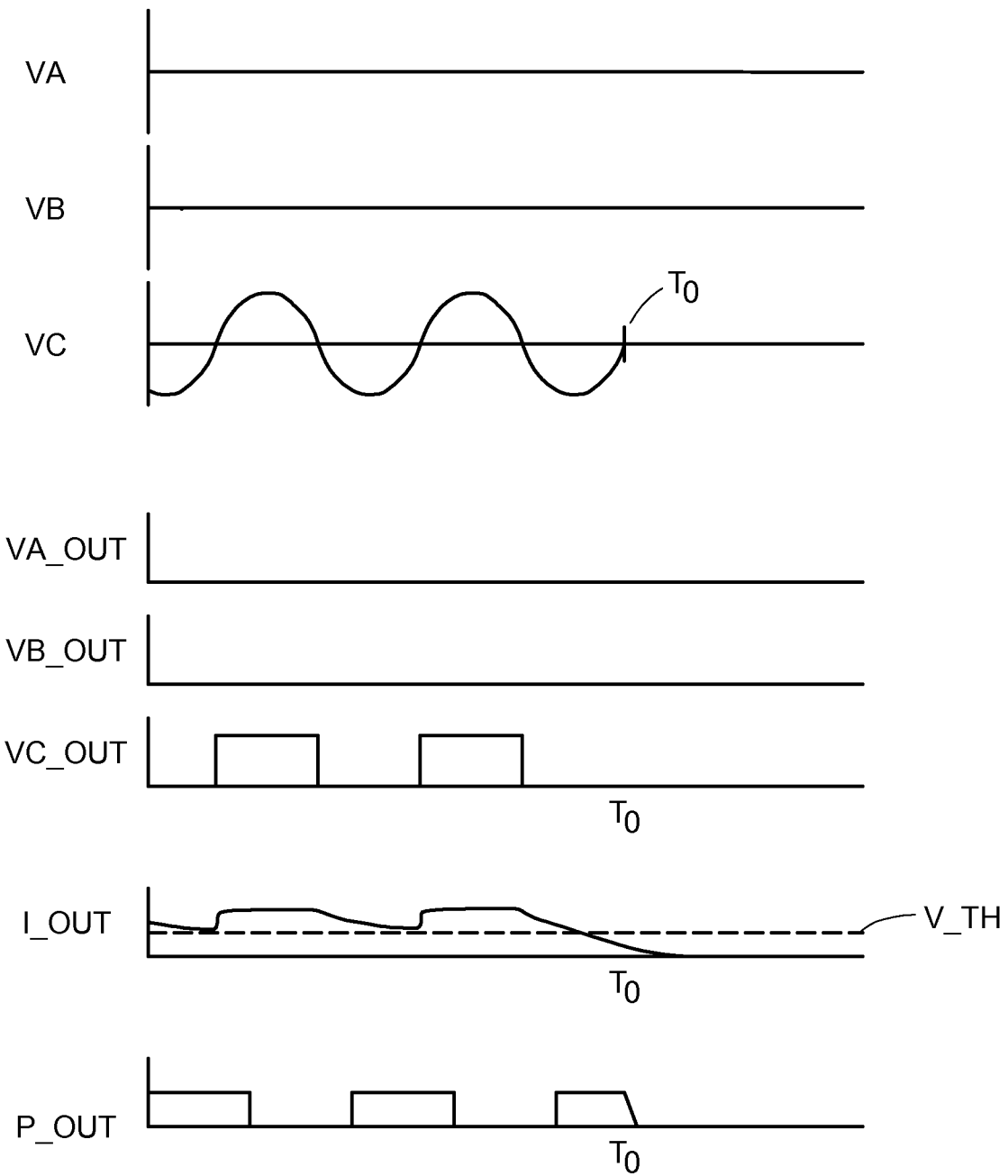
FIG. 4B shows a signal timing diagram of signals generated by the arrangement of FIG. 3 when only a single phase voltage is present, and is interrupted.

The operation of the arrangement 100 of FIG. 3 is discussed with reference to FIGS. 4A and 4B. FIG. 4A shows a signal timing diagram of various signals in the arrangement 100 when all three phase line voltages are present. FIG. 4B shows a signal timing diagram of the same signals in the arrangement wherein only a single phase line voltage is present temporarily, and then is lost.

In a first exemplary operation, with reference to FIGS. 3 and 4A, all three phase line voltages are present at the inputs 108a, 108b and 108c. In response to the phase line voltage at the input 108a, the voltage divider 114a delivers a 2.93 volt peak-to-peak AC voltage (when the AC line voltage is 120 Vrms) to the output 115a. This signal at the output 115a is shown as signal VA of FIG. 4A. The operation of the other voltage dividers 114b, 114c is similar, and the respective signals at the outputs 115b and 115c are shown, respectively, as signals VB and VC of FIG. 4A.

The resistor R4, which forms the input of the zero crossing circuit 116a, obtains the signal VA from the output 115a. The source VDD and the resistors R4, R5 operate to adjust the signal to essentially a phase inverted (and further scaled) version of VA, offset by 3.3 volts DC. For example, the signal VA_IN present at the inverting input when the AC line voltage is 120 Vrms is expressed by the following equation:

$$VA\_IN = 3.3 VDC + 1.46 Vpeak * \sin(2*\pi*frequency*time) \quad (1)$$

The resistor divider R7, R9 and R10 sets the threshold voltage at which U113 will switch from a logic "0" to a logic "1". In the embodiment of FIG. 3, the threshold voltage at the non-inverting input of the comparator 116a is 3.09 VDC, where VDD=3.3 VDC.

When the signal present at VA<3.09 VDC, the output of U113 (VA_OUT) remains at its logical level "1". Otherwise, the output of the comparator U113 switches to its logical level "0". The resistor R9 limits the gain of U113 and provides some amount of hysteresis in the circuit to improve its performance under external electrical noise that might be produced by RF interference. The signal at the output 117a is illustrated as signal VA_OUT of FIG. 4A.

The operation of the respective zero crossing circuits 116b, 116c, are analogous to that described above in connection with the voltage divider 114a. The signals VB_OUT and VC_OUT of FIG. 4A illustrate the signals present at the outputs 117b and 117c.

The combiner 118 thereafter receives pulse output signals VA_OUT, VB_OUT and VC_OUT from the respective zero crossing detectors 116a, 116b and 116c. Specifically, the diodes D1, D2 and D3 receives the pulse signals from the outputs 117a, 117b and 117c. The diodes D1, D2 and D3 operate to ensure that the only the highest instantaneous voltage (minus the forward diode drop) at any of the outputs 117a, 117b and 117c exists at the node 118a.

The integrator 120 operates to integrate the output signal at the node 118a. The integrator 120 maintains the signal at its output at a level that exceeds the reset voltage of the LM555 Timer U116 so long as any one of the outputs 117a, 117b, and 117c provide period pulses. Accordingly, in the operation wherein all three phase line voltages are present, as shown in FIG. 4A, the integrator 120 generates the signal I_OUT of FIG. 4A.

The timer circuit U116 receives the signal I_OUT at the input pin RESET, which exceeds the reset voltage threshold V_TH of timer circuit U116. As a consequence, the timer circuit U116 operates to produce a 50% duty cycle, 60 Hz pulse signal at the output pin OUT. This signal is represented as P_OUT of FIG. 4A.

The P_OUT signal provided at the output pin OUT and the oscillator output 122b may then be used by the power down control circuit 102 and meter timing circuit 104 (or controller 220 of FIG. 2) as discussed above.

FIG. 4B shows the same signals as FIG. 4A, except where only a single phase line voltage is present until the time $T_0$. Moreover, after the time $T_0$, no line voltages are present. Thus, the time $T_0$ represents the moment that all line voltages are lost within the meter.

Referring now to FIGS. 3 and 4B, because no line voltage is present at the input 108a, the voltage VA at the voltage divider output 115a is 0 volts. (See FIG. 4B). As a result, the voltage at negative input of the comparator U113 remains at 3.3 VDC, which is above the threshold voltage 3.09 VDC at the positive input of the comparator U113. Accordingly, the voltage VA_OUT at the output 117a of the zero crossing circuit 116a holds at 0 volts. (See FIG. 4B. Similarly, because no line voltage is present at the input 108b, the signal VB at the output 115b and the signal VB_OUT at the output 117b are also 0 voltages.

However, prior to $T_0$, voltage is present on the phase C line voltage input 108c. As a consequence, the output 115c of the voltage divider 114c includes the reduced line voltage signal VC as shown in FIG. 4B. The zero crossing detector 116c detects the zero crossing of the reduced line voltage signal VC and produces a corresponding pulse signal VC_OUT.

The combiner 118 thereafter (and prior to $T_0$) receives the single pulse signal VC_OUT. The integrator 120 operates to integrate the signal VC_OUT, thereby producing an output signal I_OUT that remains above the threshold voltage V_TH at all times before $T_0$, as shown in FIG. 4B. Thus, the integrator 120, as discussed above, has a time constant such that a single 60 Hz pulse signal such from a single zero crossing detector, such as VC_OUT, is sufficient to keep LOUT above the threshold voltage V_TH of the timer circuit U116. Because the voltage at the input RESET of the timer circuit U116 is above the threshold voltage V_TH, the timer circuit U116 generates the same 50% duty cycle 60 Hz pulse output signal P_OUT at the OUT as that shown in FIG. 4A.

At $T_0$, the phase C line voltage is interrupted at the input 108c. As a consequence, none of the phase line voltages are present. At this time, VC becomes 0 volts. At the transition time $T_0$, the zero crossing detector 116c stops generating pulses, as illustrated by VC_OUT of FIG. 4B. When VC_OUT fails to produce additional pulses, the integrator 120 operates to let the signal I_OUT at its output to decay below the reset voltage V_TH of the LM555 Timer within 40 ms. (See FIG. 4B).

When the timer circuit U116 receives no voltage, or a voltage that is otherwise less than the reset voltage threshold V_TH, at the input pin RESET, the timer circuit U116 stops producing the pulse signal at the output pin OUT. At that point, the power down control circuit 102 operates as described above to carry out the power down operations specific to the meter.

It will be appreciated that the term "zero-crossing detector" as used herein does not specifically refer to a circuit that detects an exact point at which an alternating signal crosses zero volts. In general, the term "zero-crossing detector" detects when a signal crosses any threshold in an alternating signal. In this embodiment, for example, the zero-crossing detectors 116a, 116b and 116c do not specifically change states when the input AC line voltage crosses zero volts. Instead the zero-crossing detectors 116a, 116b and 116c change output states when the AC signal crosses over a threshold that is a small quantity above zero volts. Nevertheless, each transition may generally be associated with a corresponding zero crossing of the AC input signal. For example, if the threshold may suitably be +15 volts, then each transition above and below 15 volts in a 120 volt RMS signal can be associated with a zero crossing of the 120 volt RMS signal.

It will further be appreciated that the exemplary meter 200 of FIG. 2 includes a three phase power supply, not shown, that is configured to provide bias power to the measurement circuit 206 and other devices during normal operation, so long as power is present on any one of the phase voltage lines 24a, 24b, 24c. Such devices are known, and include inputs connected to the voltage lines 24a, 24b, 24c, and bias voltage outputs to at least the various circuits 206, 210, 116a, 116b, 116c, 122 and 212.

It will be appreciated that the above described embodiments are merely exemplary, and that those of ordinary skill in the art may readily devise their own implementations that incorporate the principles of the present invention and fall within the spirit and scope thereof.

What is claimed is:

1. A circuit arrangement for generating an output oscillating signal indicative of voltage on any of plurality of line voltages, comprising:
   a first zero-crossing detection circuit configured to detect a voltage crossing on a first electrical signal corresponding to a first line voltage;
   a second zero-crossing detection circuit configured to detect a voltage crossing on a second electrical signal corresponding to a second line voltage;
   a combiner configured to combine output signals of the first zero-crossing detection circuit and the second zero-crossing detection circuit;
   an integrator coupled to an output of the combiner;
   an oscillator having a control input and an oscillating signal output, the oscillator configured to generate an oscillating signal at the oscillating signal output based on a signal present at the control input, and wherein the control input is operably coupled to receive an output signal of the integrator.

2. The circuit arrangement of claim 1, further comprising a third zero-crossing detection circuit configured to detect a voltage crossing on a third electrical signal, the third zero-crossing detection signal having an output connected to the combiner.

3. The circuit arrangement of claim 1, wherein the combiner comprises a logical OR circuit.

4. The circuit arrangement of claim 1, wherein the oscillator is further configured to generate the oscillating signal at the oscillating signal output responsive to the signal present at the control input exceeding a first threshold.

5. The circuit arrangement of claim 4, wherein the integrator circuit has a time constant configured to generate an integrator output signal in excess of the first threshold for at least one half-duty cycle and less than one duty cycle of the power line signal responsive to receiving a positive output signal from the combiner circuit.

6. The circuit arrangement of claim 1, wherein the first zero-crossing detector circuit includes an arrangement for superimposing a DC voltage on the first electrical signal.

7. The circuit arrangement of claim 1, wherein the oscillator is a timer circuit.

8. A circuit for use in a utility meter:
   a first voltage sensor generating a first electrical signal corresponding to a first line voltage;
   a second voltage sensor generating a second electrical signal corresponding to a second line voltage;
   a first zero-crossing detection circuit configured to detect a voltage crossing on the first electrical signal;
   a second zero-crossing detection circuit configured to detect a voltage crossing on the second electrical signal;
   a combiner configured to combine output signals of the first zero-crossing detection circuit and the second zero-crossing detection circuit;
   an integrator coupled to an output of the combiner;
   an oscillator having a control input and an oscillating signal output, the oscillator configured to generate an oscillating signal at the oscillating signal output based on a signal present at the control input, and wherein the control input is operably coupled to receive an output signal of the integrator.

9. The circuit arrangement of claim 8, further comprising a power down control circuit operably coupled to the oscillating signal output, the power down control circuit configured to cause storage of metering data to non-volatile memory responsive to absence of the oscillating signal at the oscillating signal output.

10. The circuit arrangement of claim 9, wherein the power down control circuit is further configured to cause a transmitter to transmit information to a remote device responsive to the absence of the oscillating signal at the oscillating signal output.

11. The circuit arrangement of claim 10, further comprising a timing circuit configured to operate a meter timing function based on the oscillating signal at the oscillating signal output.

12. The circuit arrangement of claim 9, further comprising a timing circuit configured to operate a meter timing function based on the oscillating signal at the oscillating signal output.

13. The circuit arrangement of claim 12, wherein the oscillator is further configured to generate the oscillating signal at the oscillating signal output responsive to the signal present at the control input exceeding a first threshold.

14. The circuit arrangement of claim 13, wherein the integrator circuit has a time constant configured to generate an integrator output signal in excess of the first threshold for at least one half-duty cycle and less than one duty cycle of the power line signal responsive to receiving a positive output signal from the combiner circuit.

* * * * *